United States Patent [19]

Falckenberg et al.

[11] 4,062,653

[45] Dec. 13, 1977

[54] POWDER FLOW CONTROL DEVICE FOR GROWING VERNEUIL CRYSTALS

[75] Inventors: Richard Falckenberg, Unterhaching, Germany; Ali Abd el Wahid, Cairo, Egypt

[73] Assignee: Siemens Aktiengesellschaft, Berlin & Munich, Germany

[21] Appl. No.: 725,672

[22] Filed: Sept. 22, 1976

[30] Foreign Application Priority Data

Sept. 25, 1975 Germany ............................ 2542886

[51] Int. Cl.² ............................................. B01J 17/24
[52] U.S. Cl. .................................. 23/273 V; 156/615; 222/409; 222/414; 222/198
[58] Field of Search .................. 156/615; 23/273 V; 222/409, 414, 298, 200, 198; 209/236, 235

[56] References Cited

U.S. PATENT DOCUMENTS

| | | | |
|---|---|---|---|
| 1,505,723 | 8/1924 | Mueller | 222/414 |
| 1,855,214 | 4/1932 | Alton | 222/414 |
| 2,591,561 | 4/1952 | Lester | 156/615 |
| 2,737,319 | 3/1956 | Rayburn | 222/414 |
| 3,086,850 | 4/1963 | Marino, Jr. | 156/615 |
| 3,221,938 | 12/1965 | Yonkers | 222/414 |
| 3,511,614 | 5/1970 | Wenckus | 23/273 V |
| 3,519,394 | 7/1970 | Petit-Le Du | 23/273 V |
| 3,620,423 | 11/1971 | Dalgleish | 222/414 |
| 3,917,459 | 11/1975 | Falckenberg | 156/615 |
| 3,960,503 | 6/1976 | Rice | 156/615 |

FOREIGN PATENT DOCUMENTS 1,474,902  1967  France ............................... 222/200

*Primary Examiner*—Stephen J. Emery
*Attorney, Agent, or Firm*—Hill, Gross, Simpson, Van Santen, Steadman, Chiara & Simpson

[57] ABSTRACT

Powder flow in an apparatus for growing crystals according to the process of Verneuil, whereby powder falls downwardly into a flame impinging on and melting a surface of a seed crystal, is made uniform by isolating the powder supply container from oscillations in the air column beneath the container induced by vertical movements of a screening grid in the apparatus. Isolation is effected by a rotating sphere in a flow tube of the apparatus between the supply container and the oscillating screen, the sphere having close tolerances to the wall of the tube and vertical grooves in its periphery. The vertical grooves and the sphere surface also can meter the falling powder.

10 Claims, 2 Drawing Figures

POWDER FLOW CONTROL DEVICE FOR GROWING VERNEUIL CRYSTALS

BACKGROUND OF THE INVENTION

1. Field of the Invention

The invention relates to devices for control of powder supply in a crystal growing apparatus.

2. The Prior Art

Several devices for supplying powder to an apparatus for crystal growing according to the Verneuil process are known as, for example, from U.S. Pat. No. 3,917,459, as well as German Patent application P 25 24 783. Generally, Verneuil crystals are produced by supplying a powder to a crystalline material in a flame which melts the powder and directs the melt to a seed crystal being impinged upon by the flame. During the process, the seed crystal is melted at its top or upper surface by the impinging flame and is gradually withdrawn from the region of the flame while, simultaneously, a supply of crystalline material is fed to the melt so that the material progressively crystallizes out of the melt onto the seed crystal. The newly formed, predominantly mono-crystalline material forms the desired crystal as an elongation of the seed crystal.

In known manner of powder conveyance from a supply container, very fine powder to be used in the crystal growth passes by gravity through a bottom screen of the supply container. A second screen having a very fine mesh passes only very fine-particled powder to a flame thereunder. The screens are oscillated to facilitate the passing of powder therethrough. The oscillations, especially vertical oscillations, are known to make the powder feed from the supply container into the flame non-uniform. Detailed studies have shown that vertical oscillations in the air column in the space between the second screen and the supply container cause uncontrolled powder discharges from the supply container.

SUMMARY OF THE INVENTION

A rotating sphere is arranged for rotation about a horizontal axis in a tube connecting a supply container to a powder funnel and above an oscillatable screen in an apparatus for growing crystals as according to the Verneuil process. The sphere is rotated about its horizontal axis by a motor drive at a rate adapted to transport a desired volume of powder to the vertically oscillating screen. The sphere fits the tube so that only a small gap is left about its periphery. This sphere keeps oscillations of the air column from affecting the flow of powder from the supply container. The sphere may either serve as a lower closure of the supply container or it can be located between first and second screens conventionally provided in a Verneuil apparatus. Vertical grooves in the surface of the sphere may be used to increase powder flow.

DESCRIPTION OF THE PREFERRED EMBODIMENTS

Figure 1:
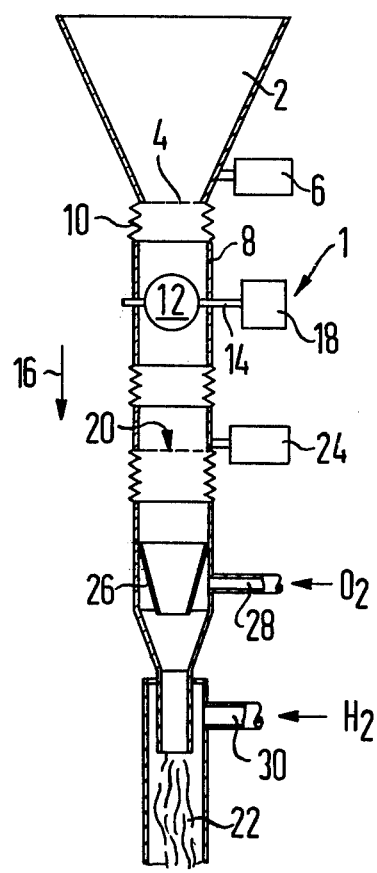
FIG. 1 is a side, sectional view, partially schematic, through a device in accordance with the invention.

An apparatus for growing crystals according to Verneuil is shown at 1 in FIG. 1. The apparatus 1 comprises a series of powder flow control devices arranged along a vertical axis. A funnel-shaped supply container 2 is fitted with a first screen 4 at its bottom or constricted end. An oscillator drive 6 drives the supply container 2 and the first screen 4 in horizontal oscillations.

A hollow tube 8 is connected beneath the supply container 2 by a flexible sleeve 10 which isolates the tube 8 from the oscillations of the supply container 2. The sleeve 10 seals the container 2 to the tube 8 so that powder cannot escape and foreign material cannot enter. In accordance with the invention, a conveyor sphere 12 is arranged on a horizontal shaft 14 and centered in the interior of the tube 8. A motor drive 18 selectively rotates the shaft 14 and the conveyor sphere 12 attached thereto, for rotation of the surface of the sphere 12 parallel to a conveyance direction 16 vertically through the tube 8. An annular, ring-shaped gap is left between the sphere 12 and the interior of the tube 8 in the horizontal plane. The gap 19 and features of the surface of the sphere 12 are dimensioned so that no powder collects above the sphere 12. Once the size and surface parameters are fixed, however, the transport capability can be varied within limits by variation in the speed of rotation of the sphere 12 on the axle 14, as induced by the drive 18.

The lower end of the tube 8 is connected by a further moveable sleeve to a further section of tubing carrying on a lower portion thereof a second screen 20 which is driven in vertical oscillations by an oscillator drive 24. The second screen 20 has a very fine mesh to filter and distribute the powder falling through the apparatus. Vertical oscillations of the air column above the screen 20 are prevented by the sphere 12 from interfering with the passage of powder through the first screen 4 from the supply container 2. Powder passing through the screen 20 passes through the funnel 26 therebelow and into a hydrogen-oxygen flame 22. The oxygen and hydrogen are respectively provided through supply tubes 28, 30. The oxygen is admitted to the powder flow passage about the funnel 26, so that some of the powder is entrained therein.

Figure 2:
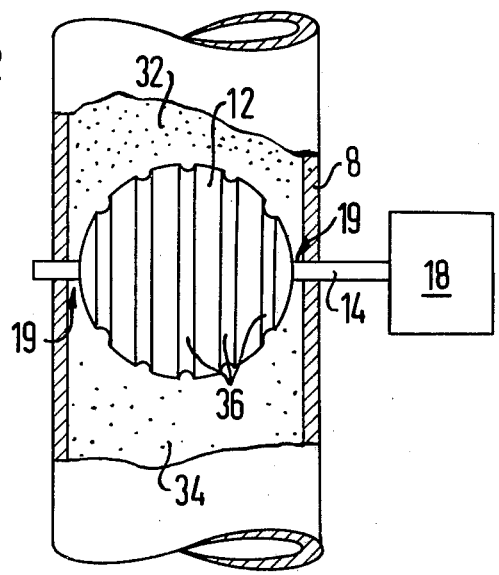
FIG. 2 is an enlarged elevational view, partly in section, through the portion of the device of FIG. 1 in which the conveyor sphere is mounted.

FIG. 2 shows an enlarged view of the center of the tube 8 wherein the conveyor sphere 12 is mounted for rotation. Powder 32 falls through the upper portion of the tube 8 from the supply container 2 onto and about the surface of the sphere 12. Rotation of the sphere 12 about the shaft 14 conveys powder through substantially one half of the ring-shaped gap 19 about the sphere to fall as powder 34 through the tube 8. Grooves 36 are provided in the surface of the sphere 12 to extend about the periphery of the sphere 12 in a vertical direction, corresponding to parallels of latitude on a globe. Thus the grooves 36 are circular, with their centers lying on the shaft 14. The form, number, and size of the grooves 36 determines the volume of powder which may be conveyed by the sphere 12. With semi-circular grooves 36 as shown, the gap 19 between the sphere 12 and the tube 8 can be kept especially small, thereby insuring isolation of the supply container 2 from oscillations of air induced by the screen 20.

In one embodiment, a sphere 12 having a diameter of 100mm was favorably provided with grooves 36 each having a semicircular cross-section of radius of about 3mm at intervals of 20mm along the axis of the sphere. The gap width between the ungrooved portions of the sphere surface and the tubular part 8 was about 0.5mm. When this sphere 12 having such dimensions was revolved at 2 rpm, 0.5 to 2 grams per minute of fine-particled aluminum oxide was transported.

It has been found to be feasible to employ the conveyor sphere 12 directly to close of the bottom of the supply container 2, in lieu of a first screen 4. In this case the sphere 12 also meters the powder supply, in contrast to the metering in the embodiment shown by the screen 4 and the oscillator drive 6. Although this and various other minor modifications may be suggested by those versed in the art, it should be understood that we wish to embody within the scope of the patent warranted hereon all such modifications as reasonably and properly come within the scope of our contribution to the art.

We claim as our invention:

1. A device for growing Verneuil crystals comprising:
    a powder supply container having a lower outlet;
    a horizontal screen arranged vertically below said outlet;
    oscillator drive means connected to said screen for driving said screen in vertical oscillations;
    a hollow tube connecting said container outlet and said screen for passage of powder therebetween; and
    a conveyor sphere mounted in said tube between said container outlet and said screen on a horizontal shaft through said tube, said sphere being rotated by a motor drive, and the sphere forming an annular ring gap between a surface thereof and an interior surface of the tube.

2. A device for growing Verneuil crystals as defined in claim 1, wherein said motor drive includes means for selectively varying the rate of rotation of said sphere on said shaft, thereby to control a rate of powder flow.

3. A device for growing Verneuil crystals as defined in claim 1, further comprising a second horizontal screen arranged upwardly of said conveyor sphere and adjoining said outlet of said container, the second screen being horizontally oscillatable.

4. A device for growing Verneuil crystals as defined in claim 1, wherein the conveyor sphere has at least one groove formed in its surface.

5. A device for growing Verneuil crystals as defined in claim 4, wherein each said groove is concentric with the axis of rotation of the sphere and each groove is spaced apart axially of said shaft from each other groove.

6. A device for growing Verneuil crystals as defined in claim 4, wherein each said groove has a semi-circular cross-section.

7. In a device for growing Verneuil crystals and having a powder supply container having a lower outlet and a vertically-oscillatable screen in a sealed flow tube wherein an upper end of said flow tube is connected to said lower outlet end for powder flow therethrough, an improvement for isolating the supply container lower outlet from a vertically-oscillating air column in said tube created by the screen, comprising:
    a rotatable shaft extending transversely to said flow tube;
    a sphere affixed to said shaft for rotation therewith, the sphere having a diameter slightly less than a diameter of the flow tube; and
    a drive means to rotate said shaft and sphere at a selected rate.

8. The improved apparatus of claim 7, wherein the sphere has at least one groove formed in its exterior.

9. The improved apparatus of claim 7, wherein each said groove extends in a circle about the sphere and is vertical in orientation.

10. The improved apparatus of claim 7, wherein each said groove has a semi-circular cross-section.

* * * * *